(12) United States Patent
Simitci et al.

(10) Patent No.: US 8,473,778 B2
(45) Date of Patent: Jun. 25, 2013

(54) ERASURE CODING IMMUTABLE DATA

(75) Inventors: Huseyin Simitci, Maple Valley, WA (US); Yikang Xu, Redmond, WA (US); Haiyong Wang, Redmond, WA (US); Aaron William Ogus, Redmond, WA (US); Bradley Gene Calder, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 477 days.

(21) Appl. No.: 12/877,175

(22) Filed: Sep. 8, 2010

(65) Prior Publication Data
US 2012/0060072 A1    Mar. 8, 2012

(51) Int. Cl.
*G06F 11/10*    (2006.01)
(52) U.S. Cl.
USPC .......................................... 714/6.2
(58) Field of Classification Search
USPC .......................................... 714/6.2
See application file for complete search history.

(56) References Cited

U.S. PATENT DOCUMENTS

| | | | | |
|---|---|---|---|---|
| 5,845,474 | A * | 12/1998 | Loftus | 56/291 |
| 7,069,295 | B2 * | 6/2006 | Sutherland et al. | 709/203 |
| 7,296,180 | B1 * | 11/2007 | Waterhouse et al. | 714/6.12 |
| 7,386,757 | B2 * | 6/2008 | Lindenstruth et al. | 714/6.1 |
| 7,574,527 | B1 * | 8/2009 | Tormasov et al. | 709/243 |
| 7,581,156 | B2 | 8/2009 | Manasse | |
| 7,743,276 | B2 * | 6/2010 | Jacobson et al. | 714/6.32 |
| 7,992,037 | B2 * | 8/2011 | Dubnicki et al. | 714/6.2 |
| 8,046,426 | B2 * | 10/2011 | Medard et al. | 709/217 |
| 8,051,362 | B2 * | 11/2011 | Li et al. | 714/776 |
| 8,200,706 | B1 * | 6/2012 | Sim-Tang | 707/797 |
| 8,307,263 | B2 * | 11/2012 | Grube et al. | 714/770 |
| 2008/0313241 | A1 | 12/2008 | Li et al. | |
| 2010/0094958 | A1 | 4/2010 | Zuckerman et al. | |

OTHER PUBLICATIONS

Bhagwan, et al., "Total Recall: System Support for Automated Availability Management", Mar. 31, 2004, Proceedings of the First Symposium on Networked Systems Design and Implementation, San Francisco, California, 26 pages.
Weil, et al., "Crush: Controlled, Scalable, Decentralized Placement of Replicated Data", Nov. 2006, Tampa, Florida, IEEE, 12 pages.
Albano, et al., "Distributed Erasure Coding in Data Centric Storage for Wireless Sensor Networks", Jul. 2009, Pisa, Italy, 6 pages.

(Continued)

*Primary Examiner* — Stephen M Baker
(74) *Attorney, Agent, or Firm* — Shook Hardy & Bacon LLP

(57) ABSTRACT

Embodiments of the present invention relate to systems, methods and computer storage media for erasure coding data in a distributed computing environment. A sealed extent is identified that is comprised of two or more data blocks and two or more index blocks. The sealed extent is optimized for erasure coding by grouping the two or more data blocks within the optimized sealed extent together and grouping the two or more index blocks within the optimized sealed extent together. The optimized extent may also be erasure coded, which includes creating data fragments and coding fragments. The data fragments and the coding fragments may also be stored in the distributed computing environment. Additional embodiments include monitoring statistical information to determine if replication, erasure coding or a hybrid storage plan should be utilized.

20 Claims, 9 Drawing Sheets

OTHER PUBLICATIONS

Thereska, et al., "Informed Data Distribution Selection in a Self-Predicting Storage System", Jan. 2006, Parallel Data Laboratory, Carnegie Mellon University, Pittsburgh, Pennsylvania, 23 pages.

Dimakis, et al., "Network Coding for Distributed Storage Systems", Feb. 2, 2007, University of California, Berkeley, 9 pages.

Zhang, et al., "RepStore: A Self-Managing and Self-Tuning Storage Backend with Smart Bricks", 2004, Microsoft Research Asia, 8 pages.

Cooley, et al., "Software-Based Erasure Codes for Scalable Distributed Storage", 2003, Proceedings of the 20th IEEE/11th NASA Goddard Conference on Mass Storage Systems and Technologies, 8 pages.

"Reed-Solomon Codes", 2007, Komodo Industries, Inc., La Jolla, California, 5 pages.

James S. Plank, "A Tutorial on Reed-Solomon Coding for Fault-Tolerance in RAID-Like Systems", Department of Computer Science, University of Tennessee, 19 pages.

Blomer, et al., "An XOR-Based Erasure-Resilient Coding Scheme", Aug. 1995, International Computer Science Institute, 21 pages.

Luigi Rizzo, "Effective Erasure Codes for Reliable Computer Communication Protocols", University of Pisa, Pisa, Italy, 13 pages, From ACM Computer Communication Rev, Apr. 1997.

James S. Plank, "Enumeration of Optimal and Good Cauchy Matrices for Reed-Solomon Coding", Dec. 8, 2005, University of Tennessee, Knoxville, Tennessee, 71 pages.

Hafner, et al., "Matrix Methods for Lost Data Reconstruction in Erasure Codes", FAST '05: 4th USENIX Conference on File and Storage Technologies, USENIX Association, 14 pages.

Plank, et al., "Note: Correction to the 1997 Tutorial on Reed-Solomon Coding", Apr. 24, 2003, University of Tennessee, 6 pages.

James S. Plank, "Optimizing Cauchy Reed-Solomon Codes for Fault-Tolerant Storage Applications", Dec. 2005, University of Tennessee, Knoxville, Tennessee, 12 pages.

Reed, et al., "Polynomial Codes Over Certain Finite Fields", Jun. 1960, J. Soc. Ind. Appl. Math vol. 8, approx. pp. 300-304.

Rhea, et al., "Pond: The OceanStore Prototype", 2003, 2nd USENIX Conference on File and Storage Technologies, Worcester Polytechnic Institute, 25 pages.

* cited by examiner

ERASURE CODING IMMUTABLE DATA

BACKGROUND

Traditionally, distributed computing environments rely on replication to achieve desired levels of availability and reliability of data used within the environment. However, each additional replication of an object adds to the storage costs of that object. Developers, administrators, and users of a distributed computing environment may try and balance the desire for durability and availability with resource costs to achieve the desired levels.

SUMMARY

Embodiments of the present invention relate to systems, methods and computer storage media for erasure coding data in a distributed computing environment. A data stream stored in the distributed computing environment comprised of at least one sealed read-only extent (sealed extent) may be identified for erasure coding. The sealed extent is comprised of one or more data blocks and one or more index blocks. The sealed extent is optimized for erasure coding. Optimizing may include grouping two or more data blocks within the optimized sealed extent together and grouping two or more index blocks within the optimized sealed extent together. The optimized extent may also be erasure coded. Erasure coding may include creating a predefined number of data fragments and a predefined number of coding fragments. The predefined number of data fragments and the predefined number of coding fragments may also be stored in the distributed computing environment.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE SEVERAL VIEWS OF THE DRAWINGS

Illustrative embodiments of the present invention are described in detail below with reference to the attached drawing figures, which are incorporated by reference herein and wherein.

DETAILED DESCRIPTION

Figure 1:
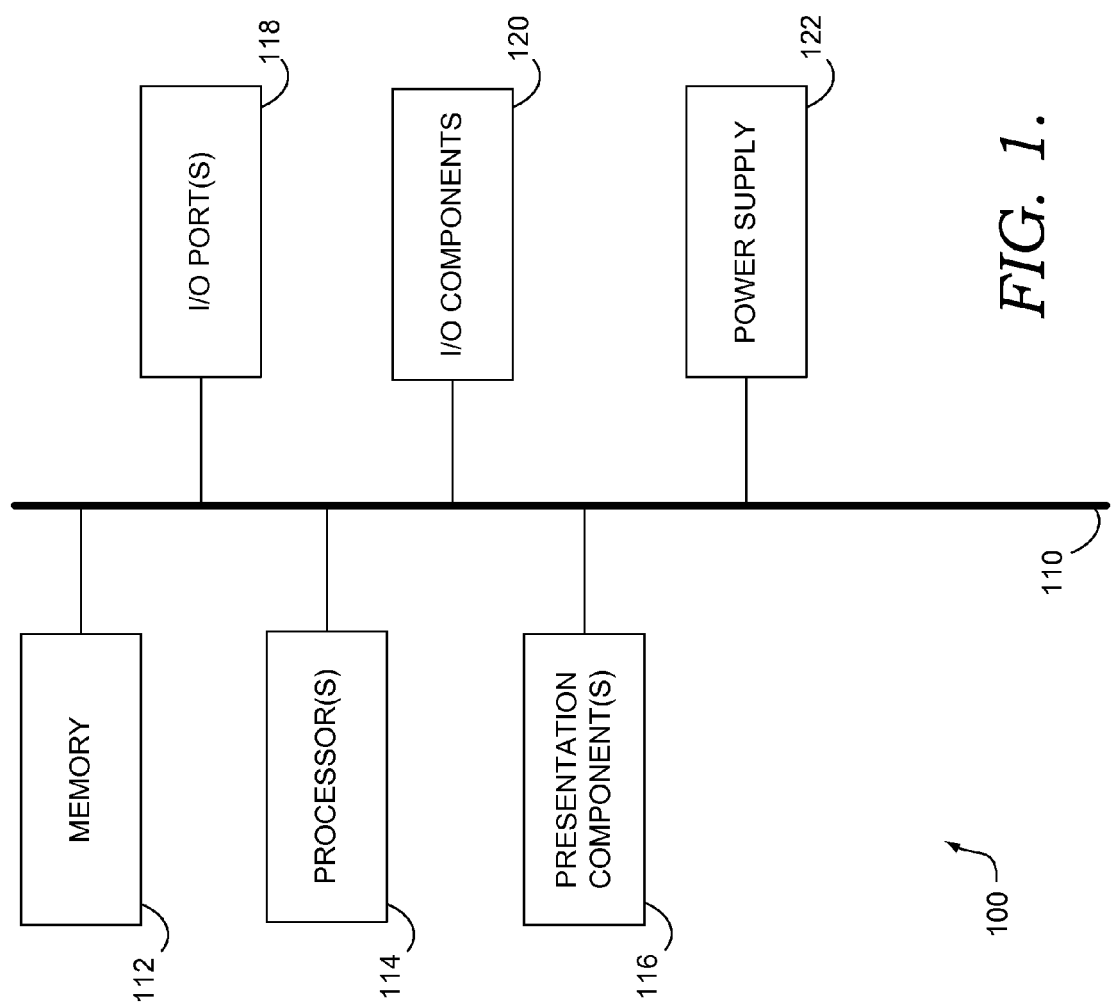
FIG. 1 depicts an exemplary computing device suitable for implementing embodiments of the present invention.

The subject matter of embodiments of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies.

Embodiments of the present invention relate to systems, methods and computer storage media for erasure coding data in a distributed computing environment. A data stream stored in the distributed computing environment comprised of at least one sealed read-only extent (sealed extent) may be identified for erasure coding. The sealed extent is comprised of one or more data blocks and one or more index blocks. The sealed extent is optimized for erasure coding. Optimizing may include grouping two or more data blocks within the optimized sealed extent together and grouping two or more index blocks within the optimized sealed extent together. The optimized extent may also be erasure coded. Erasure coding may include creating a predefined number of data fragments and a predefined number of coding fragments. The predefined number of data fragments and the predefined number of coding fragments may also be stored in the distributed computing environment.

Accordingly, in one aspect, the present invention provides a method in a distributed computing environment for erasure coding data. The method includes identifying a data stream or extents of a data stream for erasure coding. The data streams and/or extents of the data stream may be stored in the distributed computing environment comprised of at least one sealed read-only extent (sealed extent). The sealed extent is comprised of two or more data blocks and two or more index blocks. The method also includes optimizing, with a processor in the distributed computing environment, the sealed extent. Optimizing includes grouping the two or more data blocks within the optimized sealed extent together and grouping the two or more index blocks within the optimized sealed extent together. The method also includes erasure coding the optimized sealed extent. Erasure coding includes creating a predefined number of data fragments. The predefined number of data fragments are created by dividing data represented by the two or more data blocks of the optimized sealed extent into the predefined number of data fragments and creating a predefined number of coding fragments, wherein the coding fragments are created based, at least in part, on the data fragments. The method also includes storing the predefined number of data fragments and the predefined number of coding fragments in the distributed computing environment.

In another aspect, the present invention provides computer storage media having computer-executable instructions embodied thereon, that when executed by a distributed computing environment having a processor and memory, cause the distributed computing environment to perform a method. The method includes monitoring a demand for a data stream stored in the distributed computing environment. The data stream is comprised of at least one sealed append-only extent (sealed extent). The sealed extent is comprised of two or more data block and two or more index blocks. The method also includes determining the demand for the data stream is below a predefined demand threshold. As a result of the demand for the data stream being below the predefined demand threshold, the method includes erasure coding the sealed extent such that one or more data fragments are created and one or more coding fragments are created. Each data block of the two or more data blocks does not span across more than one of the one or more data fragments. The method also includes storing each of the one or more data fragments and each of the one or more coding fragments in one or more nodes of the distributed computing environment.

A third aspect of the present invention provides a system for erasure coding a read-only sealed extent in a distributed computing environment. The system includes a cluster manager. The cluster manager performs a method, which includes identifying, based on statistical information interpreted by the cluster manager, a read-only sealed extent to which erasure coding is to be applied. The read-only sealed extent is comprised of two or more data blocks and two or more index blocks. The method also includes optimizing the read-only sealed extent to result in an optimized extent. Optimizing includes grouping the two or more data blocks within the optimized extent together and grouping the two or more index blocks within the optimized extent together. The method further includes erasure coding the optimized extent. Erasure coding is comprised of creating a predefined number of data fragments. The predefined number of data fragments are created by apportioning data represented by the two or more data blocks of the optimized extent into the predefined number of data fragments. Erasure coding also includes creating a predefined number of coding fragments. The coding fragments are created based, at least in part, on the data fragments. The system also includes a plurality of storage nodes that are utilized to store the predefined number of data fragments and the predefined number of coding fragments. The number of the plurality of storage nodes is equal to or greater than the predefined number of data fragments.

Having briefly described an overview of embodiments of the present invention, an exemplary operating environment suitable for implementing embodiments hereof is described below.

Referring to the drawings in general, and initially to FIG. 1 in particular, an exemplary operating environment suitable for implementing embodiments of the present invention is shown and designated generally as computing device 100. Computing device 100 is but one example of a suitable computing environment and is not intended to suggest any limitation as to the scope of use or functionality of the invention. Neither should the computing device 100 be interpreted as having any dependency or requirement relating to any one or combination of modules/components illustrated. In an exemplary embodiment of the present invention, the computing device 100 is implemented as part of a distributed computing environment to be discussed in more detail with respect to FIG. 2 hereinafter.

Embodiments may be described in the general context of computer code or machine-useable instructions, including computer-executable instructions such as program modules, being executed by a computer or other machine, such as a personal data assistant or other handheld device. Generally, program modules including routines, programs, objects, modules, data structures, and the like, refer to code that performs particular tasks or implements particular abstract data types. Embodiments may be practiced in a variety of system configurations, including hand-held devices, consumer electronics, general-purpose computers, specialty computing devices, distributed computers, servers, storage nodes, cluster managers, etc. Embodiments may also be practiced in distributed computing environments where tasks are performed by remote-processing devices that are linked through a communications network.

With continued reference to FIG. 1, computing device 100 includes a bus 110 that directly or indirectly couples the following devices: memory 112, one or more processors 114, one or more presentation modules 116, input/output (I/O) ports 118, I/O modules 120, and an illustrative power supply 122. Bus 110 represents what may be one or more busses (such as an address bus, data bus, or combination thereof). Although the various blocks of FIG. 1 are shown with lines for the sake of clarity, in reality, delineating various modules is not so clear, and metaphorically, the lines would more accurately be grey and fuzzy. For example, one may consider a presentation module such as a display device to be an I/O module. Also, processors have memory. The inventors hereof recognize that such is the nature of the art, and reiterate that the diagram of FIG. 1 is merely illustrative of an exemplary computing device that can be used in connection with one or more embodiments. Distinction is not made between such categories as "workstation," "server," "laptop," "hand-held device," etc., as all are contemplated within the scope of FIG. 1 and reference to "computer" or "computing device."

Computing device 100 typically includes a variety of computer-readable media. By way of example, and not limitation, computer-readable media may comprise Random Access Memory (RAM); Read Only Memory (ROM); Electronically Erasable Programmable Read Only Memory (EEPROM); flash memory or other memory technologies; CDROM, digital versatile disks (DVD) or other optical or holographic media; magnetic cassettes, magnetic tape, magnetic disk storage or other magnetic storage devices, or any other medium that can be used to encode desired information and be accessed by computing device 100.

Memory 112 includes computer-storage media in the form of volatile and/or nonvolatile memory. The memory may be removable, non-removable, or a combination thereof. Exemplary hardware devices include solid-state memory, hard drives, optical-disc drives, etc. Computing device 100 includes one or more processors that read data from various entities such as memory 112 or I/O modules 120. Presentation module(s) 116 present data indications to a user or other device. Exemplary presentation modules include a display device, speaker, printing module, vibrating module, and the like. I/O ports 118 allow computing device 100 to be logically coupled to other devices including I/O modules 120, some of which may be built in. Illustrative modules include a microphone, joystick, touch pad, touch screen, motion capture, game pad, satellite dish, scanner, printer, wireless device, and the like.

Figure 2:
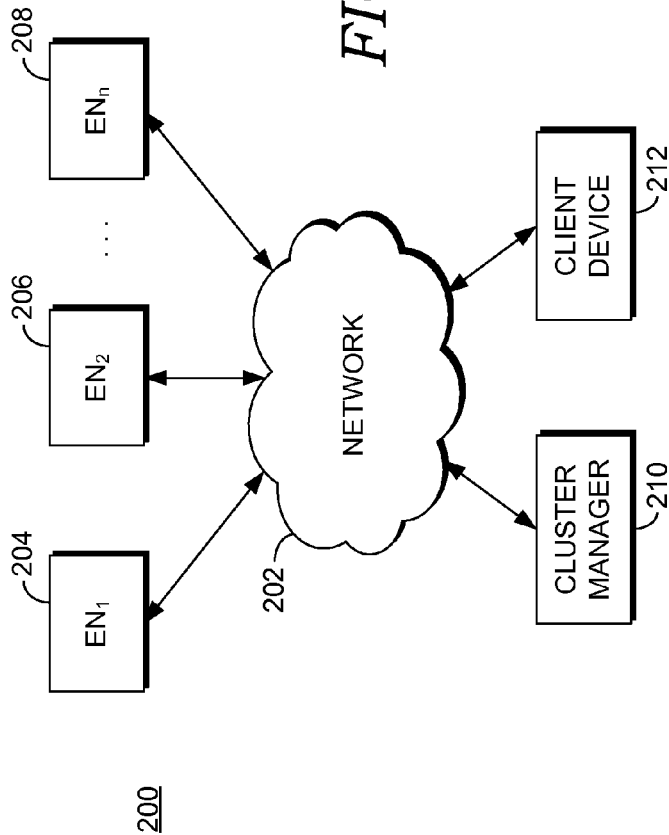
FIG. 2 depicts a block diagram illustrating an exemplary distributed computing environment in which embodiments of the present invention may be employed.

With reference to FIG. 2, a block diagram is provided illustrating an exemplary distributed computing environment 200 in which embodiments of the present invention may be employed. It should be understood that this and other arrangements described herein are set forth only as examples. Other arrangements and elements (e.g., machines, interfaces, processors, memory, servers, storage nodes, cluster managers, networks, interfaces, functions, orders, and grouping of the above, etc.) can be used in addition to or instead of those shown, and some elements may be omitted altogether. Further many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

Among other components not shown, the distributed computing environment 200 may include a first extent node 204, a second extent node, 206, an "N" extent node 208, a cluster manager 210, and a client device 212. Each of the components shown in FIG. 2 may be any type of computing device, such as computing device 100 described with reference to FIG. 1, for example. The components may communicate with each other via a network 202, which may include, without limitation, one or more local area networks (LANs) and/or wide area networks (WANs). Such networking environments are commonplace in offices, enterprise-wide computer networks, intranets, and the Internet. It should be understood that any number of extent nodes, cluster managers, client devices, servers, processors, and networks may be employed within the distributed computing environment 200 within the scope of the present invention. Additionally other component not shown may also be included within the distributed computing environment 200.

The first extent node 204, the second extent node 206, and the "N" extent node 208 (collectively herein the extent nodes) are storage nodes within a distributed computing environment. In an exemplary embodiment, the extent nodes are functional for maintaining persistently one or more extents of a data stream for use by an application and/or a client in a distributed computing environment. For example, extent nodes may be utilized in a streaming storage system, such as XSTREAM by Microsoft Corporation of Redmond, Wash. A streaming storage system may strive to provide reliability in a scalable system through the replication (i.e., multiple copies) of stored objects over multiple storage servers, isolated fault domains, and isolated upgrade domains. An extent is a cluster of data within a data stream that will be discussed in more detail hereinafter with respect to FIGS. 3 and 4. Therefore, in an exemplary embodiment, an extent node serves extents to an application and/or a client of a distributed computing environment.

It is contemplated that any number of extent nodes may be utilized in the distributed computing environment 200. It is contemplated that the first extent node 204 may be physically coupled to the second extent node 206 in an exemplary embodiment. However, in an exemplary embodiment, while the first extent node 204 and the second extent node 206 may be physically coupled to one another (e.g., disposed within a common server rack, disposed within a common set of server racks), the first extent node 204 and the second extent node 206 are in separate fault domains from one another. A fault domain is considered a point of failure that should not extend to another fault domain. For example, a server within a first rack assembly may lose power as the result of the failure of the PDU within that rack assembly, but a server in a second rack assembly would not be affected by the failure of the PDU in the first rack assembly. Therefore, in an exemplary embodiment, two disks within a common rack may not be separate fault domains, as they both may fail as a result of a common mechanical or electrical issue. But, a first disk in a server in a first rack and a second disk in a second server in a second rack may be in separate fault domains.

Similarly, an upgrade domain is a grouping of extent nodes (and potentially other components and devices) of a distributed computing environment that may commonly fail as a result of anticipated failures (e.g., intentionally taken offline for maintenance or upgrade). In an exemplary embodiment, extent nodes implemented for maintaining fragments, replications, or other data portions are located in different fault domains and/or different upgrade domains. Upgrade domains and fault domains are not necessarily orthogonal. In an exemplary embodiment, each individual data portion (e.g., data fragment, coding fragment) of a common extent are maintained by a different extent node that is located in a different fault domain and in a different upgrade domain from each other. In an additional exemplary embodiment, as will be discussed in more detail hereinafter, a predefined number "N" extent nodes of a total number "M" extent nodes used to maintain data portions of an extent are located in different fault domains and/or upgrade domains. For example, if nine (9) (i.e., "M") data portions are used to maintain an extent, then at least six (6) (i.e., "N") different upgrade domains are utilized to maintain the data portions (e.g., nine data portions spread across at least six extent nodes that are in different fault domains; nine data portions spread across nine extent node in six different upgrade domains).

The cluster manager 210 is a role within the distributed computing environment 200 that controls and manages reliability of data accessible by way of the distributed computing environment 200. The cluster manager 210 is discussed herein as performing one or more operations or tasks, it is contemplated that the cluster manager 210 performs one or more of these tasks by initiating a process within the system to carry-out the operation or task. For example, as will be discussed hereinafter, the cluster manager "generates," "optimizes," "maintains," "determines," and the like. However, it is contemplated that the cluster manager performs each of these tasks by initiating a process or other operation to facilitate the performance of that task. Consequently, in embodiments, the cluster manager 210 doe not, by itself, perform the various tasks, but instead instantiates the tasks. Therefore, it is understood that when a cluster manager "generates," determines," and the like, that the cluster manager 210 may merely be initiating another operation to complete that identified task.

In an exemplary embodiment of the present invention, the cluster manager 210 initiates and controls erasure coding of an object (e.g., an extent). The cluster manager 210 may also monitor statistics associated with data stream, extents, and objects. The cluster manager 210 may also utilize statistics for data streams, extents, and/or objects to determine if the subject is "hot" or "cold." As will be discussed in more detail hereinafter, "hot" and "cold" may reference the demand or trend in demand for a subject. For example, an extent that is used recently or used frequently may be considered "hot" in an exemplary embodiment. Conversely, a subject that has not been used recently or has not been used frequently may be considered "cold" in an exemplary embodiment.

The cluster manager 210, in an exemplary embodiment, may also be responsible for selecting particular extent nodes to store one or more portions of data. For example, the cluster manager may select extent nodes in two or more fault domains (and/or two upgrade domains) to store data fragments and coding fragments created as part of erasure coding of an extent.

Additionally, in an exemplary embodiment, the cluster manager 210, as will be discussed in more detail hereinafter, may control failure recovery of one or more portions of data. For example, if a data fragment of an erasure coded extent is unavailable (e.g., corrupted, lost connectivity, hardware failure), the cluster manager 210 may generate, by initiating a process to create the missing fragments, the missing data fragment utilizing one or more data and/or coding fragments of the erasure coded extent.

Further, the cluster manager 210, in an exemplary embodiment, may be responsible for optimizing an extent. For example, as will be discussed in more detail hereinafter, the cluster manager 210 may defragment a sealed extent to optimize the sealed extent in anticipation of erasure coding. As previously discussed, it is contemplated that the cluster manager 210 optimizes an extent by initiating a process for the extent to be optimized. For example, the cluster manager 210 may direct an extent node hosting a particular extent to perform the actual optimization of the extent. Further, it is contemplated that an extent node, without direction from a cluster manager, may initiate the optimization of a sealed extent locally.

The cluster manager 210 may also maintain extent metadata. For example, erasure coding of an extent may generate metadata that could be used to reconstruct (e.g., un-erasure code) the extent. This may be done for purposes of generating a replica of the extent The cluster manager 210 may also, in an exemplary embodiment, be responsible for determining a reliability model for an extent. A reliability model includes identifying if an extent is to be erasure coded, if a replica of the extent is to be maintained, and how many replicas should be maintained. Additionally, in an exemplary embodiment, the cluster manager 210 may also be responsible for determining a particular format in which an extent is to be erasure coded (e.g., six data fragments/three coding fragments; twelve data fragments/four coding fragments, etc.)

The client device 212 is a client of the distributed computing environment 200. In an exemplary embodiment, the client device 212 is an application running within the distributed computing environment 200. Typically, a client device 212 is an entity that generates data maintained in one or more extent nodes or is an entity that utilizes data maintained in the one or more extent nodes.

Accordingly, any number of components may be employed to achieve the desired functionality within the scope of embodiments of the present invention. Although the various components of FIG. 2 are shown with lines for the sake of clarity, in reality, delineating various components is not so clear. Further, although some components of FIG. 2 are depicted as single blocks, the depictions are exemplary in nature and in number and are not to be construed as limiting.

Figure 3:
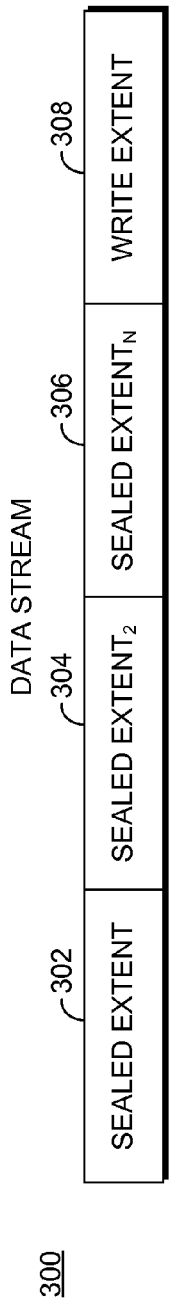
FIG. 3 depicts an exemplary data stream in accordance with embodiments of the present invention.

FIG. 3 depicts an exemplary data stream 300 in accordance with embodiments of the present invention. The data stream 300 is an append-only collection of extents. For example, the data stream 300 is comprised of a sealed extent 1 302, a sealed extent 2 304, a sealed extent N 306, and a write extent 308. It is contemplated that more or fewer extents (sealed or write) may be included with an exemplary data stream.

In an exemplary append-only data stream, the most recently created extent is the only extent to which data is written. Therefore, in this example, the write extent 308 is the only extent to which data may be written in the data stream 300. Consequently, in this embodiment, the sealed extents (302-306) are read-only extents. An extent becomes read-only (e.g., sealed) when the extent is full (i.e., reaches a predefined size of stored data), or when the extent is sealed with a command, or even when the extent is sealed due to operational failures. It is contemplated that a data stream does not include a write extent, but instead is comprised of all sealed extents. Sealed extents are immutable, which makes a sealed extent a good candidate for erasure coding.

Immutable objects (e.g., sealed extents) are favorable candidates for replication and/or erasure coding because possible failures during copy operations are simpler to recover from than a mutable object. Additionally, a mutable object traditionally requires locking or other write prevention process during a copy operation (e.g., replication, erasure coding) to facilitate consistency during copying.

As discussed previously, a data stream, such as the data stream 300, is a stream of data used within a distributed computing environment by a client (e.g., application, role). Therefore, durability and availability of the data stream is critical, in an exemplary embodiment, to the functionality of a distributed computing environment. Because of very nature of a data stream, it may be desirable to provide failure recovery mechanisms to ensure accessibility and durability. Replication, a copy of the data as a whole, may be utilized to provide more sources from which the data may be read. Another solution may include employing erasure coding of the data to increase the durability and availability of the data. Erasure coding will be discussed in greater detail herein after. Embodiments of the present invention also contemplate employing a hybrid approach that utilizes both a replication and erasure coding strategy to provide durability and availability.

Figure 4:
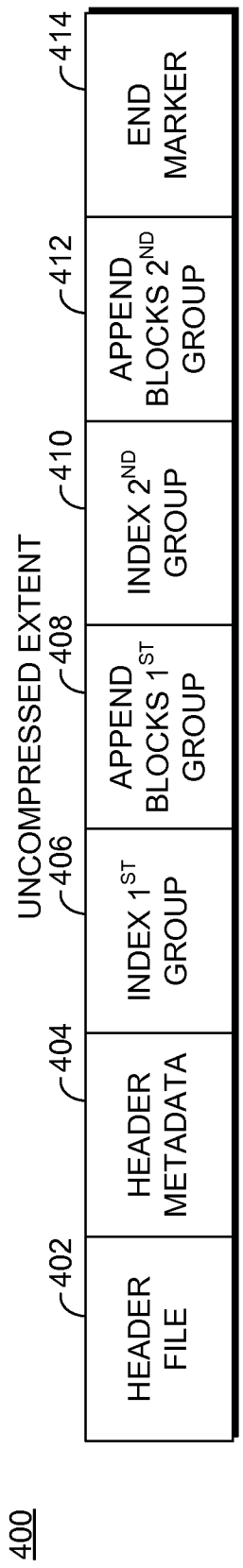
FIG. 4 depicts an exemplary uncompressed extent in accordance with embodiments of the present invention.

FIG. 4 depicts an uncompressed extent 400 in accordance with embodiments of the present invention. The uncompressed extent 400 is a sealed extent in an exemplary embodiment. Therefore, in an embodiment, the uncompressed extent 400 may be an extent that forms a data stream, such as the data stream 300 of FIG. 3. An uncompressed extent, in an embodiment, is an extent that is traditionally found within a data stream prior to being optimized. An uncompressed extent may be described as a fragmented extent in embodiments.

The uncompressed extent 400 is comprised of a header file 402, a header metadata 404, an index $1^{st}$ group 406, an append blocks $1^{st}$ group 408, an index $2^{nd}$ group 410, and append blocks $2^{nd}$ group 412, and an end marker 414. The append blocks $1^{st}$ group 408 is a collection of data blocks that are indexed by the index $1^{st}$ group 406. Because an extent is append only, index groups are interspersed with append blocks. This relationship creates a fragmented extent as there are not consistent grouping of index groups together and append blocks (i.e., data blocks) together.

In an exemplary embodiment, the compression of an extent is an extent re-authoring process to compact an extent data file. In this example, extent compression only occurs after the extent has been sealed, and therefore, more user data blocks (i.e., append blocks) are not appended to the extent, and the extent's metadata becomes immutable. As a result of this exemplary extent compression, all of the index blocks interleaved with data blocks written during the append process are combined and moved to the end of compressed data file. In this example, the grouping and moving of the index blocks has a benefit that a compressed extent can speed up the index loading process when serving a read request from a cold state (i.e., index blocks are not loaded into memory already). During an exemplary append, two extra header structures per append block are written, which are traditionally used to recover data from a physical disk when a node crashes or connectivity is lost. The additional headers may store intermediate progress information. In an exemplary embodiment, once an extent is sealed, these additional headers become redundant. An optimized (e.g., compressed) extent may not need these two additional headers, which could save 256 bytes per append block. An exemplary extent compression process can also uncompress the user data blocks then recompress it with a more efficient compression algorithm, which may further reduce disk usage by using the better compression algorithm or a high compression level of the same algorithm.

An exemplary extent compression process may be tied to a background data scrubbing process along with monitored throttling of the compression process. Consequently, the optimizing of an extent may be done as a lazy operation performed in the background. During an exemplary extent compression, both the original uncompressed extent data file and the newly compressed extent data file may co-exist under a common subdirectory with different names. This co-habitation may allow a client read request can be continuously served from the uncompressed data file. Continuing with this example, when compression of the extent completes and the system verifies there is no corruptions in the compressed file, the original uncompressed file may be deleted and the extent instance's metadata be updated.

Besides disk space saving from the removal of redundant headers and/or using better compression algorithm, compressing an extent behaves like file "defragmentation." As a result, compression may reduce data file fragmentation. This is in part a factor of the distributed computing system knowing how big the compressed data file will approximately be. Therefore, a distributed computing system may pre-allocate enough disk space to avoid disk fragmentation that is usually associated with periodically growing extent data files during normal append.

Figure 5:
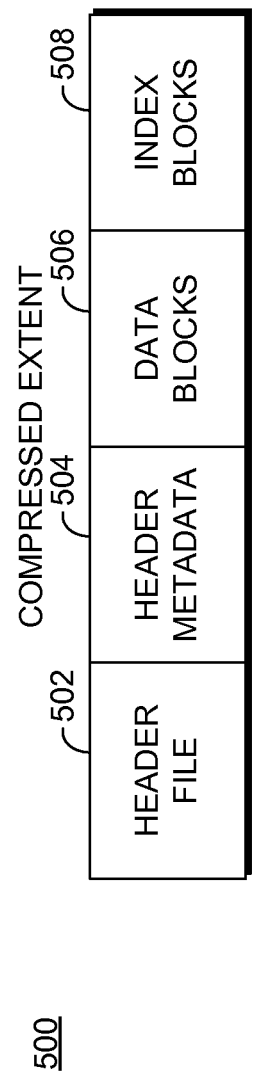
FIG. 5 depicts an exemplary compressed extent in accordance with embodiments of the present invention.

FIG. 5 depicts an exemplary compressed extent 500 in accordance with embodiments of the present invention. In an exemplary embodiment, the compressed extent 500 is an optimized version of the uncompressed extent 400 of FIG. 4. The compressed extent 500 is comprised of a header file 502, a header metadata 504, data blocks 506, and index blocks 508.

In an exemplary embodiment of the present invention, append blocks from various groups (e.g., append blocks $1^{st}$ group 408 and append blocks $2^{nd}$ group 412 of FIG. 4) of an uncompressed extent are grouped together as the data blocks 506. Additionally, in an exemplary embodiment of the present invention, index blocks (e.g., index $1^{st}$ group 406 and index $2^{nd}$ group 410 of FIG. 4) of an uncompressed extent are grouped together as index blocks 508. Similarly, in an exemplary embodiment, the header file 502 is based, at least in part (if not a copy), on a header file of an uncompressed extent (e.g., header file 402 of FIG. 4). Additionally, the header metadata 504 is based, at least in part (if not a copy), on a header metadata from an uncompressed extent (e.g., header metadata 404 of FIG. 4).

The blocks of FIG. 5 are not illustrated proportional to size of the data maintained within the individual portions. For example, the index blocks 508 may only account for 0.1% of the total data maintained within the compressed extent 500.

The data blocks 506 may be comprised of a plurality of data blocks, where each of the plurality of data blocks has defined boundaries (i.e., a start edge and an end edge). Therefore, within the data blocks 506, a plurality of data blocks may be present with each having a boundary that defines the beginning and end of that block. This boundary concept may be utilized during erasure coding. For example, in an exemplary embodiment, a data block (i.e., append block) is not split between two data fragments. Stated differently, a fragment will never end with a partial data block, in an exemplary embodiment.

Figure 6:
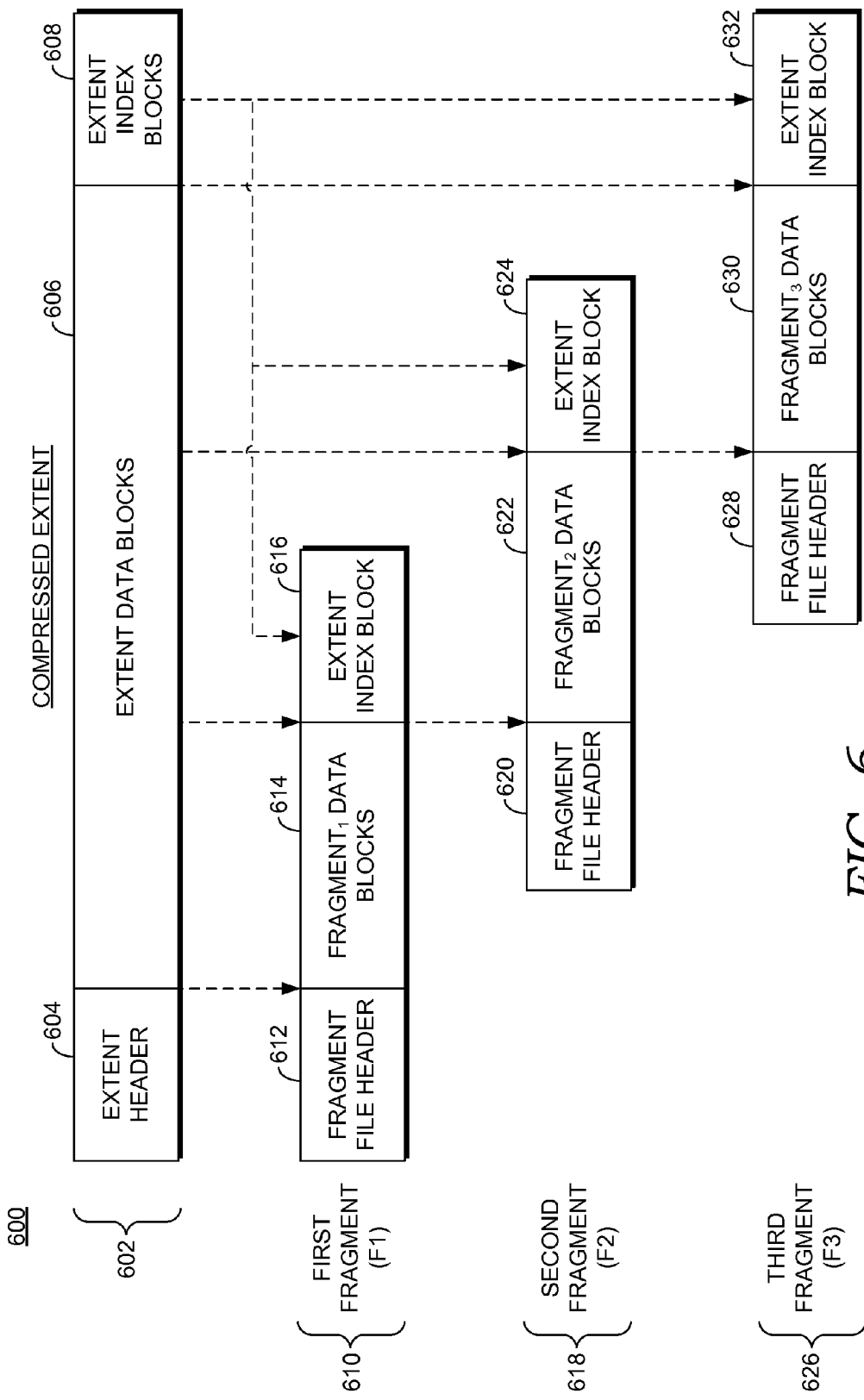
FIG. 6 depicts a compressed extent as divided among a plurality of fragments in an erasure coding process in accordance with embodiments of the present invention.

FIG. 6 depicts a compressed extent 602 as divided 600 among a plurality of fragments (i.e., 610, 618, and 626) in an erasure coding process. The compressed extent 602 is comprised of an extent header 604, extent data blocks 606, and extent index blocks 608. The compressed extent 602, in an exemplary embodiment, is similar to the compressed extent 500 of FIG. 5.

Erasure coding treats data pieces as mathematical entities and defines mathematical operations on the data pieces to create redundant data. This is instead of making copies of the data pieces as is done in replication. In coding theory, the redundant information pieces may be referred to as coding data or coding fragments. The amount of coding data is configurable to achieve different levels of space consumption and reliability targets.

Erasure coding utilizes a mathematical dependency of the coding fragments on data fragments (e.g., chunks of data blocks) during a data recovery. The dependency between the coding fragments and the data fragments allows a system to recover from the loss of data fragments or coding fragments so long as there are enough combined fragments remaining.

Erasure coding may be implemented to reduce raw storage consumption per unit of user data while still maintaining availability of the user data compared to a redundancy model. At a high level, erasure coding results in breaking down data of length N into k fragments of length approximately N/k each. Erasure coding then may create m coding fragments of a similar length so that the original data may be reconstructed from any subset of a predetermined number of fragments (e.g., k) among the total k+m fragments. For example, the data blocks of a compressed extent may be divided into six data fragments and three coding fragments may be generated. In this example, there are nine fragments (six data fragments+three coding fragments). Of the nine fragments, any three of the nine may be corrupted, lost, or unavailable and the original data blocks of the compressed extent may be recovered.

In order to apply erasure coding within a data stream of a distributed computing environment, fragment file layout and directory structure, file data I/Os, metadata management of extent fragments, serving clients' read requests, fragment scrubbing, and lazy replication, etc. have been addressed. In particular, metadata management may keep track of where all extent fragments are located, what contents are stored in each fragment, periodically check content validity; and in case of disk drive or machine becoming unavailable, how to repair the system and serve users' read requests. In this example, the expansion of erasure coding to a distributed computing environment depends on the how the fragment metadata is managed. In an effort to perform this management in an embodiment, a cluster manager (e.g., the cluster manager 210 of FIG. 2) is employed to manage fragment metadata.

Multiple formats of erasure coding may be implemented and they may be implemented simultaneously. For example, in an exemplary embodiment, a "6+3" (i.e., six data fragments+three coding fragments) configuration of Reed-Solomon erasure coding algorithm may be implemented. It is contemplated that any combination of data fragments to coding fragments may be implemented. For example, the number of data fragments may be any number 1-N where N is a positive integer. Similarly, the number of coding fragments may also be any number 1-N where N is a positive integer.

In an exemplary embodiment, as depicted in FIG. 6, erasure coding may only be applied to data blocks. However, in other embodiments, erasure coding may be applied to any elements or combination of elements that comprise an object (e.g., data blocks, header, index blocks). Returning to FIG. 6, the compressed extent 602 is an exemplary object within a data stream. Erasure coding of an extent results in one or more data fragments, such as the first fragment 610 (F1), the second fragment 618 (F2), and the third fragment 626 (F3).

Data fragments may contain a continuous portion of data blocks from the extent to be erasure coded. A data fragment may also contain all of the index blocks from the original extent. The entire extent index blocks may be maintained with each data fragment in order to serve clients' read requests. In an exemplary embodiment, all append blocks in the data fragment file are in the same compressed extent block format, in fact they are identical to those in the original extent in this embodiment. Therefore, in this exemplary embodiment, the fragments carry self-validating structure and cyclic redundancy checks (CRC), which may include header CRC, compressed data CRC, and original data CRC. Further, in this example, the fragments may include logical and physical position signatures. The inclusion of some or all of the above may allow the fragment to be built so no additional file or block validating information needs to be included for the data fragment.

In an embodiment, the data blocks in original extent and the corresponding data blocks in data fragments are both disk sector aligned and sector sized. Additionally, it is contemplated that the data blocks portion of data fragment start and end at user append block boundaries. Starting and ending at the boundaries prevents, in this example, a user append block from being split between two data fragments. Therefore, a data block, in this example, is hosted by one and only one data fragment. However, because of this file format, data fragments of an extent may not have the exact same size as one another. Consequently, it is contemplated that in an exemplary embodiment that they will be zero-padded during an erasure coding transformation.

As shown in FIG. 6, data extent fragments may have the same file format as a compressed extent data file, except the metadata header (e.g., fragment file header 612) may contain extra fragment specific information. The extra fragment information may include information as to which erasure coding algorithm is used, the fragment identifier, and a logical and physical offset range in the original extent data file for the fragment.

In an exemplary embodiment, the append blocks section (e.g., fragment 1 data blocks 614) of the fragment data files (e.g., first fragment 610) are the same as those in the original extent (i.e., compressed extent 602) bit for bit except for an origin signature field (as the origin signature field may be dependent on the actual persisted file path, which may be another form of self validation provided by aspects of this invention. Therefore, even replicas of the same extent may have different origin signature fields). The bit for bit relationship may also be extended to the index blocks (e.g., extent index block 616) section of the data fragment as to the index blocks (i.e., extent index blocks 608) of the original data file.

In an exemplary embodiment, the origin signature is converted from path-dependent to path-independent form before being communicated through a network. But at a receiving end after verification, the origin signature will be converted back to path-dependent signature again before being committed to disk. The fragment data file format may dictate how data fragments can be read, written, scrubbed, and lazily replicated. By maintain a file format as described herein between the extent and the fragments, a single file format is utilized within the system, which may keep the original self-validating structure of the extent. Additionally, in this example a format change does not occur during both the erasure coding and repair processes, which allows for intermediate steps to be verified and checked.

An example of a path-dependent origin signature includes: hash (actual on-disk file path+extent GUID+optional erasure coding algorithm+optional fragment identifier+logical user data offset in original extent+physical file offset in original extent data file). Further, an example of a path-independent origin signature includes: hash (extent GUID+optional erasure coding algorithm+optional fragment identifier+logical user data offset in original extent+physical file offset in original extent data file).

Therefore, returning to FIG. 6, the extent data blocks 606 of the compressed extent are divided among three file fragments (610, 618, and 626). Each of the file fragments includes a fragment file header (612, 620, and 628). As discussed above, these fragment file headers may include information similar to that of the extent header 604, but a fragment file header may also include additional fragment specific information (e.g., erasure coding algorithm information, fragment identifier).

Each of the three fragments of FIG. 6 also include fragment data blocks (i.e., fragment 1 data blocks 614, fragment 2 data blocks 622, and fragment 3 data blocks 630). As discussed above, each of these fragment data blocks may contain, bit for bit, the data maintained in the extent data blocks 606. Additionally, it is contemplated that each of the individual data blocks of the extent data blocks 606 are maintained whole, without splitting a data block between boundaries, when erasure coding to the various fragments.

Each of the three fragments in FIG. 6 include an extent index block (i.e., extent index block 616, 624, and 632). In an exemplary embodiment, each of the index blocks in each of the fragments is identical to one another. Further, in an exemplary embodiment, each of the extent index blocks in each of the fragments are a bit for bit copy of the extent index block 608 of the compressed extent 602. In an exemplary embodiment, the extent index block is inserted into each of the data fragments.

A data fragment index (e.g., extent index block 616) may have the same format and content as a normal extent index. Without erasure coding, an extent may only need one instance being loaded into memory to serve read requests because clients tend to use a similar extent node if previous operations were successful. However, with erasure coding, data fragments may load at least some of their indexes into memory in order to serve similar user read requests. This may cause "k" (k equals the number of data fragments for an extent) times increase in total memory consumption for indexes across all ENs, or even more if recovery is needed.

Further, consumption of memory may be reduced for the fragment indexes. For example, it is contemplated that a memory footprint may be reduced for fragment indexes by loading the index blocks serving the actual data of the fragment in to memory, while maintaining the remained in storage. This example may be implemented as the remained of index blocks may only be needed for recombined read requests, which may occur less frequently. In addition, it is contemplated that compression may be applied to the in-memory indexes. Based on data, the extent indexes may be compressed up to 80% because the way index blocks encode sizes allows those index blocks to be compressible. When it is desired to unload an index from memory, the index can be compressed and left aside. The index is only truly evicted from memory when the file has been idle for predefined length of time or memory consumption is above some threshold. This approach can benefit both fragments and normal extents.

Exemplary Erasure Coding Process

The following is an exemplary erasure coding process. Erasure coding may be initiated by a Cluster Manager (CM) of a distributed computing environment. The CM may initiate the erasure coding process based on its stream policies supplied by clients or based on dynamic analysis of the usage patterns of one or more extents. In this example, the CM can only start the erasure coding process after the extent is sealed and policies allow. Once initiated by the CM, the process happens entirely in the background (e.g., lazily) as a background operation and has minimal impact on any foreground or other background activities, such as read or lazy replication.

CM

In this exemplary embodiment of an erasure coding process, the CM does the following:

1. Allocate target extent nodes (EN) that are going to host the extent fragments based on the erasure coding algorithm, fault domain and upgrade domain constraints, and stream policies, etc.

In an exemplary embodiment, employing a "6+3" configuration of the Reed-Solomon algorithm, all 9 resulting fragments are placed in 9 different fault and upgrade domains, while one of the original replicas is hosted by a 10th upgrade and fault domain (this is an example of a hybrid method to be discussed hereinafter).

2. Create the initial fragment files on target ENs by sending them "Create Fragment" requests which include the fragment identification information and extent metadata. The CM should, in this example, send requests to each individual EN node separately. Each target EN creates the initial fragment file based on the fragment identification information, and sets a coding bit. The request may also contain the same sealed extent metadata, including published length, CRC, and timestamp, which are also committed to the fragment metadata.

3. Commit the fragment information to the extent metadata after receiving acknowledgement from target ENs. If there are any errors, the CM may initiate a retry of failed fragments.

4. Select an extent instance (source EN) and sends it an "Initiate Erasure Coding" request along with the fragment identification information and the list of target ENs committed in the previous step.

Unlike a "target driven model" in extent lazy replication, the erasure coding process may be driven by the source EN. In this "source driven model," there will be a single source EN responsible for the overall progress of all target ENs.

Letting a source EN drive the overall erasure coding process may be advantageous for at least the following reasons:

A. A source EN can optimize disk access so the entire data file is read into memory only once as the source EN can keep track of the progress made on all target ENs. If driven by target ENs, different target ENs may progress at different speed, causing data to be read multiple times or cached on the same or different source ENs.

B. It may be easier to apply overall throttling with "source driven model," where the single source EN is in control, rather than "target driven model" where all target ENs may have to coordinate among each other in order to throttle the entire erasure coding process.

C. Simpler and more robust recovery may result because the source EN now acts as the "server" for the erasure coding process. The source EN is responsible for the liveliness monitoring of the all targets and it will contact CM if a target EN becomes unavailable after adequate timeout and retries. The CM may still monitor the liveliness of the source EN. With a "target model," the CM may have to be involved to detect dead fragment targets.

Returning to the fourth step of the present exemplary erasure coding process, after hearing back the "Initiate Erasure Coding" response from the source EN. The CM may not be involved with the process anymore except in the case of failure recovery.

Source EN

Continuing with the exemplary erasure coding process, after receiving a request from the CM, a source EN may perform the following as part of the exemplary erasure coding process described herein:

1. Extent Transition To Erasure Coding: The source EN may check to ensure that its local extent instance is sealed. If the local extent is not sealed, the CM request may be rejected. A source EN will set and commit the coding bit of the extent instance metadata, and acknowledge the CM. Because the erasure coding process happens in the background in this example, the source EN may need to apply proper throttling. Additionally, the source EN may not start the erasure coding process immediately upon receiving the request. If the request in not immediately started, the source EN may keep the work item in memory along with fragment identification metadata.

Also, because erasure coding, in this example, can only start after the extent is compressed and compression is a local process that the CM is unaware of, it is possible that the extent instance has not completed compression when receiving the CM request. Therefore, the source EN may process the request and delay the actual erasure coding process at the source EN similar to other types of throttling (the coding bit may still be set regardless of compression state).

2. Once the coding bit is committed to the extent metadata and a state change is reflected in CM through "Initiate Erasure Coding" response, the source EN accepts the responsibility and is in charge of the erasure coding process. Unless the source EN becomes unavailable, CM won't start the erasure coding process on other source EN instances, in this exemplary embodiment.

3. Extent Get Fragment Info: The erasure coding process is driven by a task of the source EN node. When the layer is ready to actually start the process, it first retrieves the "fragment boundary metadata" needed for erasure coding.

4. Fragment Update Metadata: With "fragment boundary metadata" from EN and "fragment identification information" from the CM, source EN sends "Start Erasure Coding" requests to all target ENs to initiate their erasure coding tasks for the particular extent fragments.

5. At target ENs, if the fragments have only been created by the CM previously, their metadata will only have the coding bit set and thus they have no knowledge of "fragment boundary metadata." In this case, they will update and commit the fragment boundary metadata from the source EN by calling a method such as "Fragment Update Metadata" as part of the fragment metadata, transition their state from "CODING" to "INCOMPLETE and CODING." If target ENs have received "fragment boundary information" before and their metadata will have both INCOMPLETE and CODING bits set already, they will ensure their old information matches the new information from source EN. Additionally, the target ENs will return their local "fragment erasure coding progress metadata." The "erasure coding progress metadata" returned may tell the source EN the progress already made by this target. This may be beneficial for a "source driven model" in case the erasure coding process has to restart after intermediate failures. The source EN, in this embodiment, may continue from where it is left from a previous attempt.

6. Extent Raw Read/Fragment Raw Write: Once all target ENs have acknowledged the creation of fragments, the source EN reads some raw extent data from each data fragment (such as 4 MBs) location in the compressed local extent data file. The source EN may then send the data to the target ENs hosting those data fragments in parallel. In an exemplary embodiment, the data fragments are communicated to a particular target EN. The data may then be transformed to generate parity (i.e., coding fragments) contents. The source EN may then send the coding fragments to the ENs hosting the coding fragments.

In an example, during the erasure coding and recovery process, the append block data sent between ENs will be in on-disk format, which is different from data sent to client. If the end of a data fragment has been reached, the fragment may be implicitly padded with sectors of 0's to be "erasure code packet" size aligned to perform erasure transformation. Therefore, in an embodiment, the zero padding is not communicated or stored on disk as it is implicit.

7. A source EN may wait for acknowledgement from each target EN, while repeating step 6 until the entire extent is erasure coded and written successfully to all fragments. This may mean target ENs would only have 1 pending Raw Write request per fragment.

8. Finalize Erasure Coding: The source EN may read the index blocks from its local extent data file and send them to the target ENs hosting data fragments. The target ENs, in this exemplary embodiment, verifies the index blocks or CRCs from the source EN against their internal data (built based on incoming data from source EN as the data is coming in to the target EN. If the verified information matches, target ENs commit the index or CRC information to their data files; clear the INCOMPLETE and CODING bits on their fragments; and acknowledge the source EN. Because of periodic syncing with the CM, the CM may also find out "erasure coding complete" for those target ENs as well.

In an exemplary embodiment, a target fragment starts with an INCOMPLETE and a CODING bits set. On A target EN, after the content of the respective fragment has been committed to its local disk, the target EN clears its INCOMPLETE bit. On the source EN, after fragments have cleared their INCOMPLETE bits, the source EN verifies the data committed on those target ENs are correct. An embodiment of this verification process involves verifying that the CRCs of data fragments match the overall CRC of the extent data. If the CRCs are verified correctly, the source EN may tell all target ENs to clear their CODING bit. Upon receiving such request from a source EN, the target ENs clear their CODING bit if the newly completed fragments have been successfully scrubbed once. If the fragments have not been scrubbed, the target EN will inform the source EN and it will retry this step in the future. Therefore, in this exemplary embodiment, the INCOMPLETE bit indicates whether the fragment file is completed or not on local storage device; and the CODING bit indicates whether the overall erasure coding process involving all source and target ENs has been completed or not.

9. After receiving all Finalize Erasure Coding responses from target ENs in step 8, the source EN clears a local coding bit and notifies the CM about completion along with the "fragment boundary information." The CM may then commit this "fragment boundary metadata" and complete the erasure coding process. In this example, the "fragment boundary metadata" now becomes part of the extent metadata.

In an exemplary embodiment, after erasure coding completes, the CM may delete some or all of the full extent copies to reduce storage cost.

In an exemplary embodiment, data fragments must end at exact append block boundaries; therefore, all data fragments are not likely to be of the same size. For erasure coding to work in this example, all fragments will have the same length. Consequently, each data fragment may be padded with 0 sectors so they all have the same size. The padding may only happen in-memory when performing erasure coding transformations; the actual fragment data file on disk or network traffic may not contain sectors of 0s. In this example, the sectors of 0s are not stored on disk because the data fragment file is anticipated to be exactly the same as that of the extent data file.

This concludes the above-discussed exemplary erasure coding process that has been discussed immediately above. It is understood that the above exemplary coding process is merely exemplary in nature and is not limiting as to the scope of the present invention. For example, additional features may be implemented, fewer features may be implemented, combination of features may be implemented, and the like.

Erasure Coding and Replication

Figure 7:
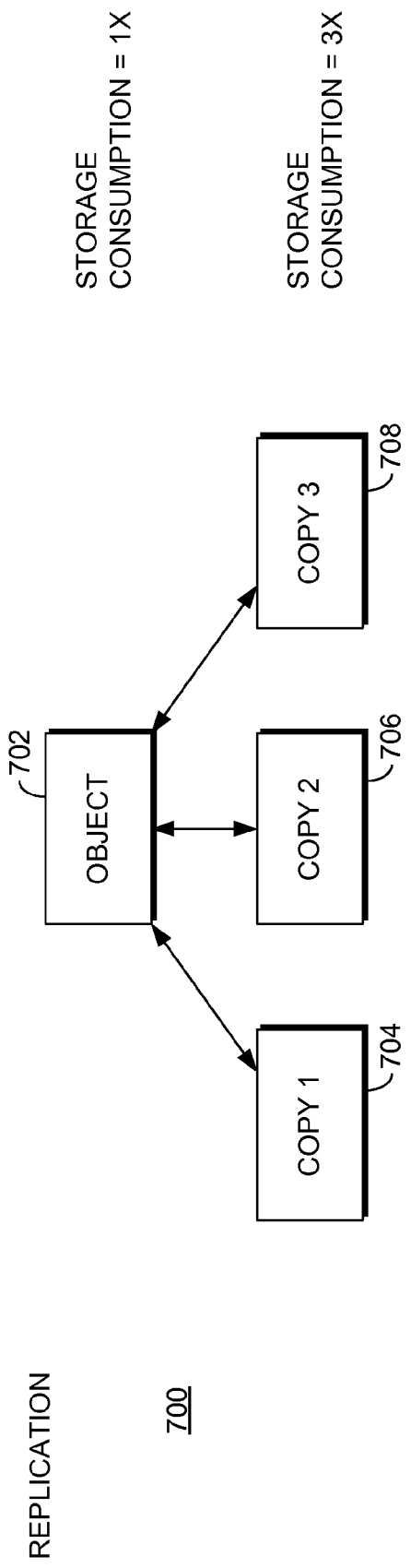
FIG. 7 depicts an exemplary replication illustration of an object in accordance with embodiments of the present invention.

FIG. 7 depicts an exemplary replication illustration 700 of an object 702 in accordance with embodiments of the present invention. Replication may be utilized to achieve durability and availability of data in a distributed computing environment. For example, the object 702 may be replicated a number of time, such as three, so that multiple copies (i.e., copy 1 704, copy 2 706, and copy 3 708) of the object 702 are stored within the distributed computing environment. As a result of having multiple copies of an object, so long as at least one of the replications of the object is available, the object as a whole may be available. Therefore, logically the more copies that are maintained in different fault domains in different upgrade domains, the greater the chance that the object is available. However, a cost of replication is storage consumption. The more copies of an object that are maintained, the greater the storage consumption cost. For example, the storage consumption of the object 702 is 1X, where X represents the size of the object 702. If three copies of the object 702 are stored, the storage consumption increases to 3X.

Consequently, a balancing act may be implemented for some objects. The balance is between availability/reliability and storage consumption. Utilization of erasure coding for objects of a data stream allows for higher availability/reliability per storage consumption cost. Additional factors may come into play when performing the balancing act, such as communication costs and processing costs.

Figure 8:
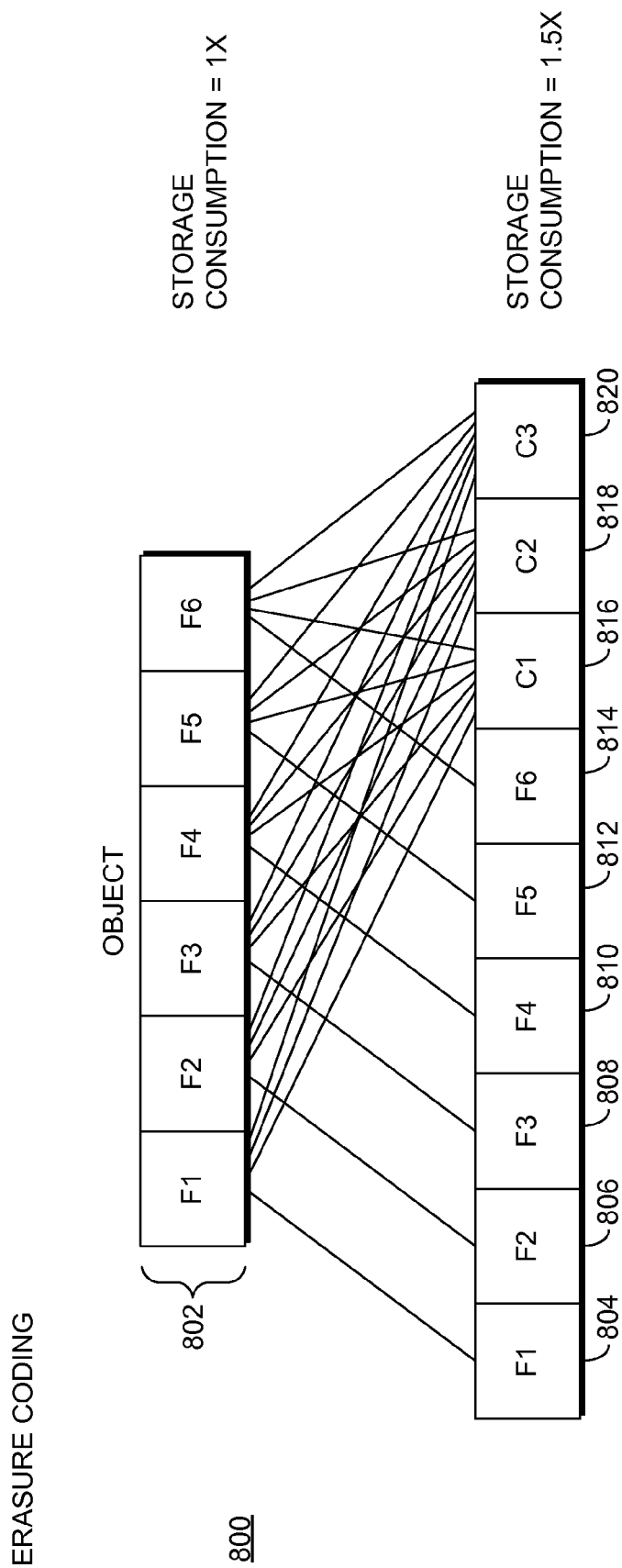
FIG. 8 depicts an exemplary erasure coding illustration in accordance with embodiments of the present invention.

FIG. 8 depicts an exemplary erasure coding 800 illustration in accordance with embodiments of the present invention. An object 802, which in an exemplary embodiment is an extent, may be erasure coded to achieve higher availability and reliability. Erasure coding divides data of an object into a plurality of data fragments, such as data fragments 804-814. Additionally, the erasure coding process also creates a plurality of coding fragments based on the data of the original object, such as coding fragments 816-820. In this example, the various fragments 804-820 represent nine different erasure coded fragments used to add durability and availability to the six portions of the object 802.

As a result of the "6+3" erasure code algorithm, the storage consumption is approximately 1.5X compared to the object 802 storage consumption of 1X. In this embodiment, each of the fragments 804-820 may have a similar size to one another (with or without sectors of 0s) the storage consumption ratio is 9/6=1.5 (9 fragments (k+m) of the erasure coding to 6 chunks (m) of the object 802). When other erasure algorithms are implemented, a similar storage consumption may be calculated (k+m)/k.

As indicated previously, other factors may be utilized when evaluating between reliability/availability and costs. For example, communication costs and processing costs. In an exemplary embodiment, communication costs and processing costs may be higher for erasure coded objects than for replicated objects. Consequently, an additional analysis may be performed to determine which process, erasure coding or replication, may be the most desirable for a given object. Additionally, the analysis may determine that a hybrid version may be desired, such as the hybrid illustrated in FIG. 9.

Figure 9:
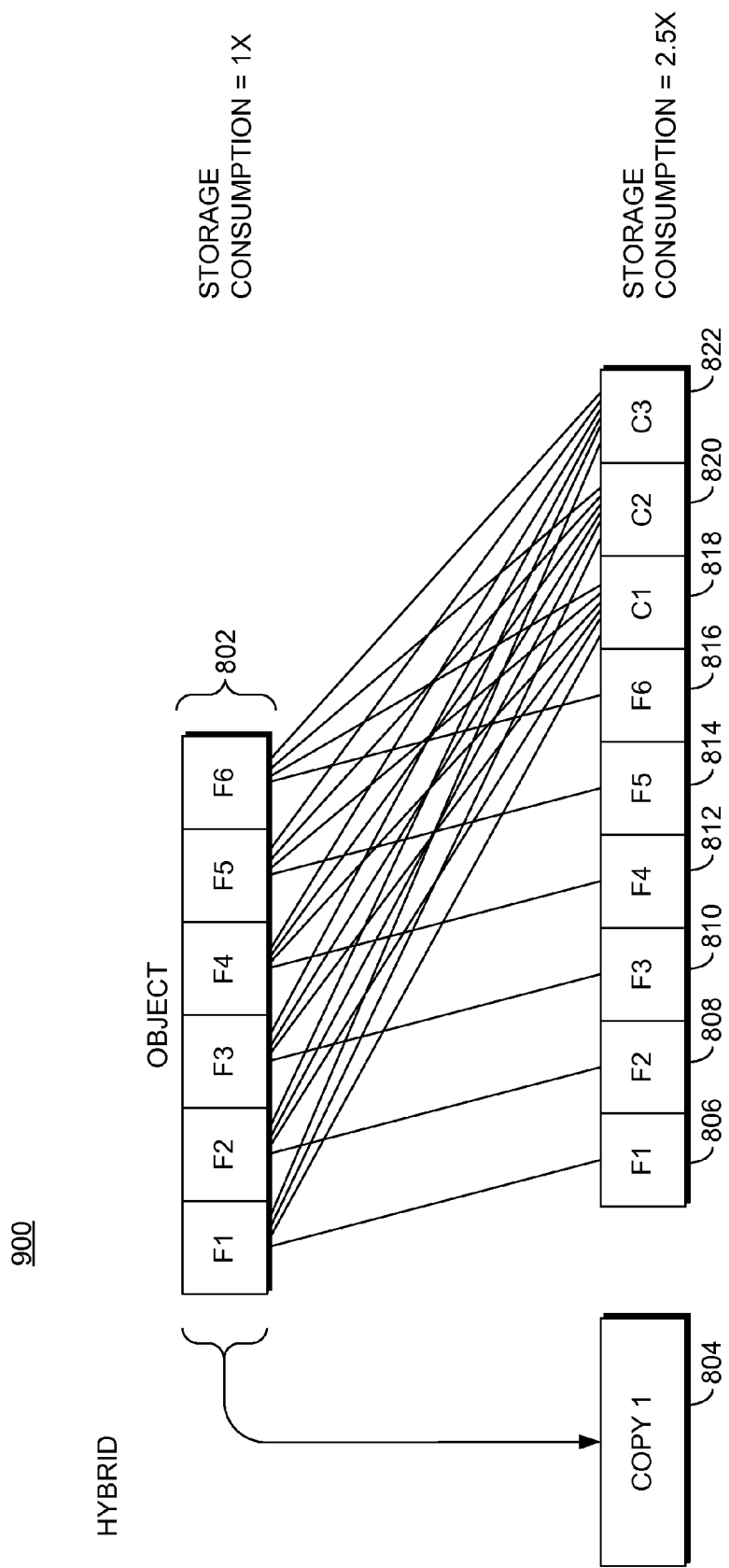
FIG. 9 depicts an exemplary hybrid storage illustration in accordance with embodiments of the present invention.

FIG. 9 depicts an exemplary hybrid storage illustration 900 in accordance with embodiments of the present invention. In this example, the object 802 is erasure coded to generate fragments 806-822 and replicated to result in copy 1 804. Therefore, the storage consumption of object 802 is 1x, but when stored in the illustrated hybrid manner raises to a storage consumption of about 2.5X. In this example, the fragments 806-822 consume 1.5X (similar to FIG. 8) plus the copy 1 804 consumes 1X (similar to FIG. 7). Therefore, by storing both the erasure fragments 806-822 and the copy 1 804, the total storage consumption may be around 2.5X.

Further, an additional hybrid approach may be to have additional data fragment instances for an erasure coding extent. For example, if a 6+3 erasure coding model is being utilized and two of the fragments are determined to be "hot," a copy of those two hot fragments may be created. This example would result in an overhead cost of (6+3+2)/6=1.83.

Also, it is contemplated herein that instead of merely creating additional hot fragment replications, caching of hot ranges of fragments in a distributed cache may be implemented. This process may be utilized for very "hot" fragments or ranges of fragments. Further, it is contemplated that the caching may be done utilizing SSD/Flash or DRAM caching space.

Therefore, it is contemplated that any of the above-referenced techniques, either alone or in combination, may be utilized to achieve a balance between durability and cost.

In an exemplary embodiment of the present invention, statistical information identifying the frequency an object (e.g., extent) is requested, how recently the object has been requested, and the status of ENs that may maintain portions of the object, and the like may be maintained. For example, a cluster manager may maintain, analyze, and disseminate this statistical information. Any or all of the information may be utilized to make a "hotness" determination of an object.

A hotness determination may be utilized to determine if replication, erasure coding, or a hybrid storage approach should be implemented for an object. For example, a hotness determination may indirectly weight out storage costs, communication costs, and processing costs to identify if an object is to be stored using replication, erasure coding, or a hybrid.

In an exemplary embodiment, the hotter an object the more weight is given to the object to being stored, at least in part, with replication. The colder an object, the more weight is given to the object being stored, at least in part, with erasure coding. In this example, a hot object is requested more frequently or more recently than a cold object; therefore, by utilizing replication, communication costs and processing costs may be reduced. On the other hand, a colder object utilizing erasure coding may reduce storage costs compared to replication. Additionally, a hybrid approach, such as that depicted in FIG. 9, may utilize the copy 1 804 for read requests, but relies on the erasure coded fragments 806-822 in the event copy 1 804 is unavailable or unreliable.

A hotness determination may be made utilizing predefined thresholds in conjunction with the statistical information. For example, if a sealed extent is not read for a given threshold of time or the frequency of reads is below a given threshold, the sealed extent may be a candidate for erasure coding. The erasure coding of the sealed extent may be performed immediately or lazily in a background process. It is understood, that if an erasure coded extent begins to become hot (or hotter), the system can create replicas (i.e., full copies) of the extent to address the additional traffic to the data of the extent. Additionally, it is contemplated that a client or a user may set parameters for individual objects or all objects for determining if erasure coding, replication or a hybrid approach should be utilized.

In an exemplary embodiment, "systematic" erasure coding algorithms are utilized. Systematic erasure coding stores portions of the original data in a subset of erasure coding fragments. This process allows direct read access to original data blocks without requiring erasure decoding (i.e., reconstruction). During system maintenance (e.g., software upgrade) the data block for a read operation may not be directly available. In this case, the data must be reconstructed from a sufficient number of other erasure coded fragment (data fragments and/or coding fragments). Reading an object in this manner may consume more time than reading a full copy replication. Therefore, a hybrid approach having a configurable number of full copies as well as the fragments from erasure coding may satisfy costs and client demands.

Other costs may be considered as well, for example, maintaining metadata associated with erasure coding consumes resources. Therefore, if an object is not above a size threshold, a determination may be made to not erasure code the object.

Figure 10:
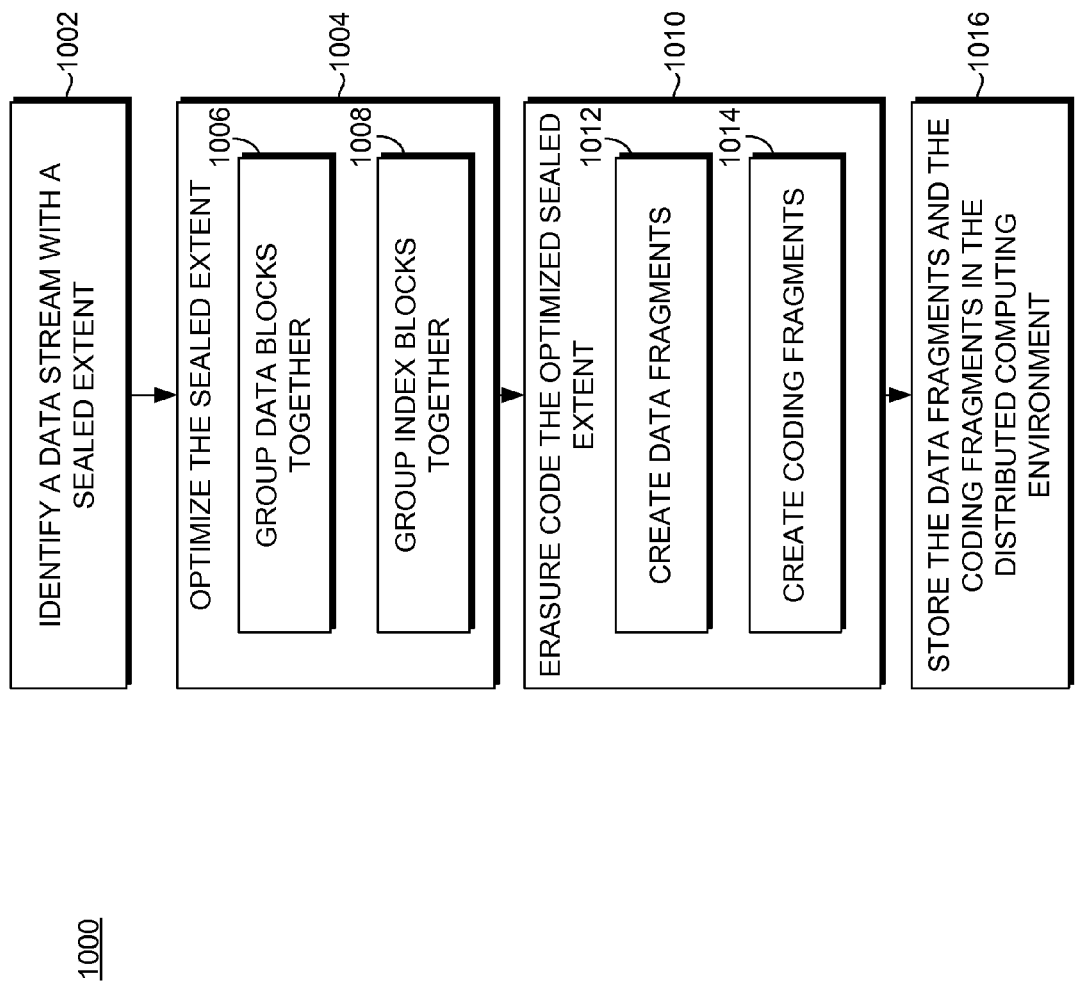
FIG. 10 depicts an exemplary method for erasure coding data in a distributed computing environment in accordance with embodiments of the present invention.

FIG. 10 depicts an exemplary method 1000 for erasure coding data in a distributed computing environment in accordance with embodiments of the present invention. At a block 1002, a data stream with a sealed extent is identified. A sealed extent, as previously discussed, is a read-only extent within an append-only data stream. The sealed extent may be comprised of data blocks (e.g., user append blocks) followed by index blocks, followed by more data blocks, and so on.

At a block 1004, the identified sealed extent is optimized. In an exemplary embodiment, a processor associated with a CM performs the optimization process. Optimization of an extent may include compressing the sealed extent to result in a compressed extent. For example, at a block 1006 data blocks of the sealed extent may be arranged and grouped together as a continuous sequence of data blocks. In this example, interwoven index blocks may be relocated within the extent so to allow the data blocks to be in a grouped collection. Similarly, at a block 1008, index blocks of the sealed extent are grouped together. In an exemplary embodiment, the process of grouping data blocks together implies that index blocks will be grouped together. The converse may also be true. In an additional exemplary embodiment, the grouping of index blocks is positioned after the grouping of data blocks. Optimization may also include removing redundant information as a result of the extent being sealed.

At a block 1010, the optimized sealed extent is erasure coded. In an exemplary embodiment, a Reed-Solomon erasure coding algorithm is implemented. The erasure coding may be comprised of creating a predefined number of data fragments. The predefined number may be any number, but in an example, the predefined number is 6. The configurable predefined number may be determined based on a client preference. In an exemplary embodiment, each of the data fragments are populated with full blocks of user data from the optimized sealed extent so that an approximate equal quantity of storage is consumed by each of the fragments. Additionally, at a block 1014, erasure coding may include creating a predefined number of coding fragments. The coding fragments are created based, at least in part, on the data fragments (e.g., the user data of the optimized extent). In an exemplary embodiment, the grouping of index blocks from the optimized sealed extent may be appended to each of the fragments (data and/or coding).

At a block 1016 the data fragments and the coding fragments are stored on extent nodes in the distributed computing environment. In an exemplary embodiment, each of the fragments is stored in a different fault domain. Additionally, in a further exemplary embodiment, each of the fragments is stored in a different upgrade domain within the distributed computing environment. It is contemplated that an extent node may utilize all types of persistent storage. For example, an extent node may utilize and combination of Flash, SSD, HDD, or the like to maintain data.

Figure 11:
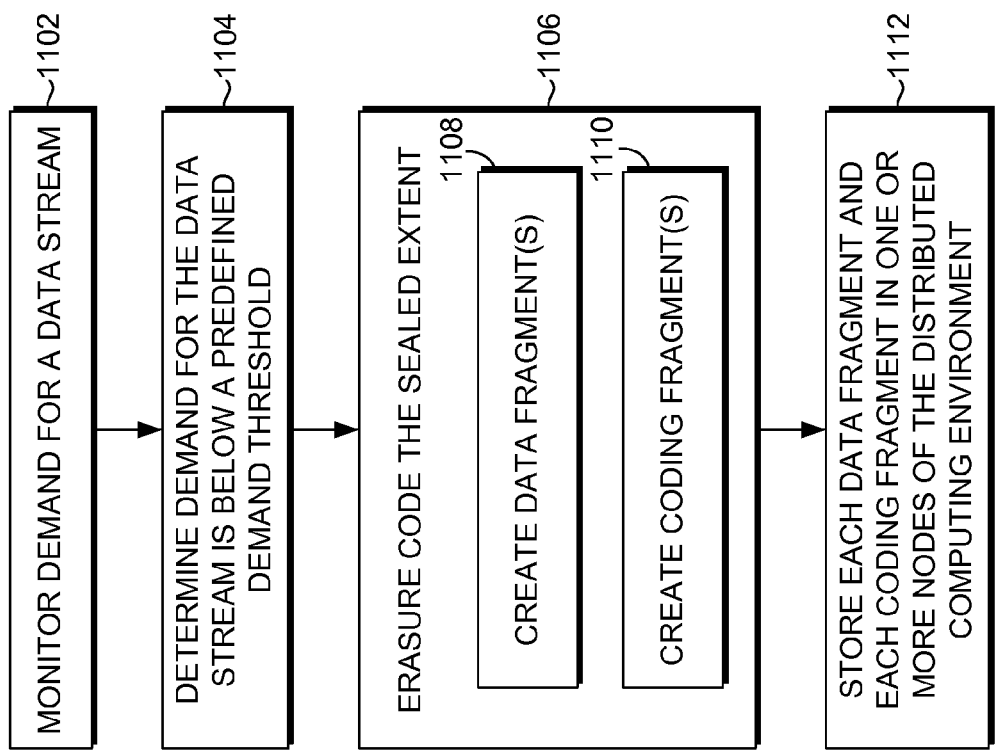
FIG. 11 depicts another exemplary method for erasure coding data in a distributed computing system in accordance with embodiments of the present invention.

FIG. 11 depicts an exemplary method 1100 for erasure coding data in a distributed computing system in accordance with embodiments of the present invention. At a block 1102, a demand for a data stream stored in the distributed computing environment is monitored. For example, demand for a data stream may be a measure of demand for one or more extents of the data stream. Therefore, demand of a "data stream" may instead relate specifically to demand for an extent of the data stream. In this exemplary embodiment, the data stream is comprised of at least one sealed extent that includes at least two data blocks and at least two index blocks. The monitoring may include evaluating statistical information associated with requests for the data stream or a particular extent. Additionally, the monitoring may evaluate the health or demands of one or more nodes used to store the data stream. The monitoring may be performed, at least in part, by a cluster manager in the distributed computing environment.

At a block 1104, a determination that demands for the data stream is below a predefined demand threshold. For example, based on the monitoring of statistical information, demand for an extent within the data stream may not exceed or fall below a predefined threshold of demand. It is contemplated that "below a threshold" is equivalent, in an exemplary embodiment, to "exceed a threshold" or the like as a common result may be achieved. The predefined threshold may be client selected, user selected, system selected, dynamic, static, or the like. The threshold may be a measure of time since a last request, a measure of frequency of request, or the like. The measure of demand may be related to a determination of "hotness" as previously discussed. Therefore, it is contemplated that demand for a data stream is a measure of demand for a particular extent within the data stream.

At a block 1106, the sealed extent of the data stream is erasure coded. The erasure coding of the sealed extent creates one or more data fragments as illustrated at a block 1108 and creating one or more coding fragments as illustrated at a block 1110. During the creation of the data fragments, data block boundaries within the sealed extent are maintained so that a data block from the sealed extent does not span across two data fragments.

At a block 1112, each of the data fragments and each of the coding fragments are stored on one or more nodes, such as extent nodes, of the distributed computing environment. As discussed previously, the fragments may be stored on unique nodes in unique fault domains. For example, if nine fragments are created, each of the fragments are stored on a different (nine different) node. It is also contemplated that six of the nine fragments, in a 6+3 erasure coding algorithm, are stored on different node in different fault domains.

As previously discussed, it is contemplated that a determination may be made to maintain or create a replication of the sealed extent (or additional replicas of specific data fragments) within the distributed computing environment. Therefore, a hybrid storage plan may be implemented utilizing both erasure coding and replication.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:
1. A method in a distributed computing environment for erasure coding data, the method comprising:
   identifying a data stream stored in the distributed computing environment comprised of at least one sealed read-only extent (sealed extent), wherein the sealed extent is comprised of two or more data blocks and two or more index blocks;
   optimizing, with a processor in the distributed computing environment, the sealed extent, wherein optimizing is comprised of:
      (1) grouping the two or more data blocks within the optimized sealed extent together and
      (2) grouping the two or more index blocks within the optimized sealed extent together;
   erasure coding the optimized sealed extent, wherein erasure coding is comprised of:
      (1) creating a predefined number of data fragments, wherein the predefined number of data fragments are created by dividing data represented by the two or more data blocks of the optimized sealed extent into the predefined number of data fragments and
      (2) creating a predefined number of coding fragments, wherein the coding fragments are created based, at least in part, on the data fragments; and
   storing the predefined number of data fragments and the predefined number of coding fragments in the distributed computing environment.

2. The method of claim 1, wherein a Reed-Solomon erasure coding is utilized for the erasure coding.

3. The method of claim 1, wherein the erasure coding is performed as a background operation in the distributed computing environment.

4. The method of claim 1, wherein the last data block of data from the two or more data blocks written to each of the predefined number of data fragments is an entire block of data.

5. The method of claim 1, wherein creating the predefined number of data fragments further comprises inserting the two or more index blocks of the sealed extent to each of the data fragments.

6. The method of claim 1, wherein each of the predefined number of data fragments is stored in a different node within the distributed computing environment.

7. The method of claim 1, wherein the predefined number of data fragments is six (6) and the predefined number of coding fragments is three (3).

8. The method of claim 1, wherein the creating the predefined number of data fragments further comprises padding each of the predefined number of data fragments with zero sectors such that each of the predefined number of data fragments are a common size.

9. The method of claim 8, wherein each of the data fragments is not committed to storage in the distributed computing environment with the zero sectors.

10. One or more computer storage media having computer-executable instructions embodied thereon, that when executed by a distributed computing environment having a processor and memory, cause the distributed computing environment to perform a method, the method comprising:
   monitoring a demand for a data stream stored in the distributed computing environment, wherein the data stream is comprised of at least one sealed extent, the sealed extent is comprised of two or more data blocks and two or more index blocks;
   determining the demand for the data stream is above or below a predefined demand threshold;
   as a result of the demand for the data stream being above or below the predefined demand threshold, erasure coding the sealed extent such that one or more data fragments are created and one or more coding fragments are created; and
   storing each of the one or more data fragments and each of the one or more coding fragments in one or more nodes of the distributed computing environment.

11. The method of claim 10, wherein the demand is monitored by identifying at least one of:
   (1) a frequency of requests for the data stream;
   (2) a duration from a last request for the data stream; or
   (3) a demand on the one or more nodes within the distributed computing environment.

12. The method of claim 10, wherein monitoring a demand for a data stream is comprised of monitoring demand for one or more extents of the data stream.

13. The method of claim 10, wherein determining the demand for the data stream is above or below the predefined threshold is performed by a cluster manager within the distributed computing environment.

14. The method of claim 10, wherein the method further comprises determining a copy of the sealed extent is to be stored in the distributed computing environment in addition to erasure coding the sealed extent.

15. The method of claim 10, wherein the method further comprises determining a copy of at least one of the data fragments is to be stored in the distributed computing environment in addition to erasure coding the sealed extent.

16. The method of claim 10, wherein each of the one or more data fragments and each of the one or more coding fragments are stored in a different node within a different fault domain within the distributed computing environment.

17. The method of claim 10, wherein the one or more nodes are at least nine (9) different nodes in different fault domains of the distributed computing environment.

18. The method of claim 10 further comprising optimizing the sealed extent, wherein optimizing the sealed extent is comprised of defragmenting the sealed extent.

19. The method of claim 18, wherein defragmenting is comprised of:
   grouping together two or more index blocks of the sealed extent; and
   grouping together two or more data blocks of the sealed extent.

20. A system for erasure coding an immutable sealed extent in a distributed computing environment, the system comprising:
   a cluster manager, the cluster manager performs a method, the method comprising:
      (1) identifying, based on statistical information interpreted by the cluster manager, a read-only sealed extent to which erasure coding is to be applied, wherein the read-only sealed extent is comprised of two or more data blocks and two or more index blocks;
      (2) optimizing the read-only sealed extent to result in an optimized extent, wherein optimizing is comprised of:
         a) grouping the two or more data blocks within the optimized extent together and
         b) grouping the two or more index blocks within the optimized extent together; and
      (3) erasure coding the optimized extent, wherein erasure coding is comprised of:
         a) creating a predefined number of data fragments, wherein the predefined number of data fragments are created by apportioning data represented by the two or more data blocks of the optimized extent into the predefined number of data fragments and
         b) creating a predefined number of coding fragments, wherein the coding fragments are created based, at least in part, on the data fragments; and
   a plurality of storage nodes that are utilized to store the predefined number of data fragments and the predefined number of coding fragments, wherein the number of the plurality of storage nodes is equal to or greater than the predefined number of data fragments.

* * * * *